(12) United States Patent
Tasaki

(10) Patent No.: US 10,658,543 B2
(45) Date of Patent: May 19, 2020

(54) SEMICONDUCTOR OPTICAL DEVICE AND METHOD OF MANUFACTURING THE SAME

(71) Applicant: DOWA Electronics Materials Co., Ltd., Chiyoda-ku, Tokyo (JP)

(72) Inventor: Norio Tasaki, Akita (JP)

(73) Assignee: DOWA Electronics Materials Co., Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 16/080,395

(22) PCT Filed: Jan. 30, 2017

(86) PCT No.: PCT/JP2017/003190
§ 371 (c)(1),
(2) Date: Aug. 28, 2018

(87) PCT Pub. No.: WO2017/154404
PCT Pub. Date: Sep. 14, 2017

(65) Prior Publication Data
US 2019/0273182 A1 Sep. 5, 2019

(30) Foreign Application Priority Data
Mar. 11, 2016 (JP) .................................. 2016-048820

(51) Int. Cl.
*H01L 33/60* (2010.01)
*H01L 33/38* (2010.01)
(Continued)

(52) U.S. Cl.
CPC .............. *H01L 33/38* (2013.01); *H01L 31/10* (2013.01); *H01L 33/40* (2013.01); *H01L 33/58* (2013.01);
(Continued)

(58) Field of Classification Search
None
See application file for complete search history.

(56) References Cited

U.S. PATENT DOCUMENTS 7,439,550 B2 * 10/2008 Tomioka ................. H01L 24/05
257/91
8,884,157 B2 * 11/2014 Lin .......................... H01L 33/38
136/252
(Continued)

FOREIGN PATENT DOCUMENTS

JP    H10135518 A    5/1998
JP    H10200162 A    7/1998
(Continued)

OTHER PUBLICATIONS

Jun. 11, 2019, Notification of Reasons for Refusal issued by the Japan Patent Office in the corresponding Japanese Patent Application No. 2016-048820.
(Continued)

*Primary Examiner* — Ali Naraghi
(74) *Attorney, Agent, or Firm* — Kenja IP Law PC

(57) ABSTRACT

Provided is a semiconductor optical device with light extraction efficiency or light collecting efficiency higher than that of conventional devices and with a reduced peeling ratio of a wiring electrode portion, and a method of manufacturing the same. In the semiconductor optical, a wiring electrode portion 120 is provided on a surface of a semiconductor layer 110 that serves as a light emitting surface or a light receiving surface, the line width $W_1$ of the wiring electrode portion 120 is 2 µm or more and 5 µm or less, the wiring electrode portion 120 has a metal layer 121 on the semiconductor layer 110 and a conductive hard film 122 on the metal layer 121, and the conductive hard film 122 is harder than the metal layer 121.

10 Claims, 5 Drawing Sheets

(51) Int. Cl.
  *H01L 33/58* (2010.01)
  *H01L 33/62* (2010.01)
  *H01L 33/40* (2010.01)
  *H01L 31/10* (2006.01)

(52) U.S. Cl.
  CPC ...... *H01L 33/62* (2013.01); *H01L 2933/0016* (2013.01); *H01L 2933/0033* (2013.01)

(56) References Cited

U.S. PATENT DOCUMENTS

| | | | | |
|---|---|---|---|---|
| 2011/0220937 | A1* | 9/2011 | Jeong | H01L 33/42 257/98 |
| 2012/0032213 | A1* | 2/2012 | Sato | H01L 33/38 257/98 |
| 2012/0292631 | A1* | 11/2012 | Katsuno | H01L 33/36 257/76 |
| 2013/0234192 | A1* | 9/2013 | Kim | H01L 33/0008 257/98 |
| 2016/0240758 | A1* | 8/2016 | Huang | H01L 33/46 |

FOREIGN PATENT DOCUMENTS

| | | |
|---|---|---|
| JP | H10200163 A | 7/1998 |
| JP | 2001004442 A | 1/2001 |
| JP | 2006245379 A | 9/2006 |
| JP | 2007258326 A | 10/2007 |
| JP | 2008288548 A | 11/2008 |
| JP | 2011066453 A | 3/2011 |
| JP | 2011100829 A | 5/2011 |
| JP | 2013211595 A | 10/2013 |
| JP | 2015204333 A | 11/2015 |
| WO | 2012120894 A1 | 9/2012 |

OTHER PUBLICATIONS

Apr. 11, 2017, International Search Report issued in the International Patent Application No. PCT/JP2017/003190.

Sep. 11, 2018, International Preliminary Report on Patentability issued in the International Patent Application No. PCT/JP2017/003190.

Feb. 4, 2020, Notification of Reasons for Refusal issued by the Japan Patent Office in the corresponding Japanese Patent Application No. 2016-048820.

* cited by examiner

SEMICONDUCTOR OPTICAL DEVICE AND METHOD OF MANUFACTURING THE SAME

TECHNICAL FIELD

This disclosure relates to a semiconductor optical device and a method of manufacturing the same.

BACKGROUND

Semiconductor optical devices are broadly fall into light-emitting devices and light-receiving devices. Known light-emitting optical devices include semiconductor light-emitting diodes (LEDs) which emit light having a specific wavelength from infrared to ultraviolet as a center wavelength. Further, known light-receiving semiconductor optical devices include semiconductor light receiving devices which convert optical signals and light energy into electrical signals and solar cells which convert light energy such as solar light into electrical energy.

Of these semiconductor optical devices, for example, light-emitting semiconductor light-emitting diodes emit light by converting electric current flown through p-n junctions into light energy. As a means to improve the light emission efficiency of semiconductor light-emitting diodes, there is a demand for a technique for improving the extraction efficiency of light emitted from a light emitting layer in a semiconductor layer.

In light receiving semiconductor light receiving device and solar cells, light received at pn junctions is converted into electrical energy due to the photovoltaic effect, and the resultant electrical energy is used in the applications such as photodetectors and generation of electrical power. There is a demand for a technique for improving light harvesting efficiency in order to increase the collection efficiency or sensitivity for semiconductor light receiving devices, and in order to increase the light conversion efficiency for solar cells. Surface roughening of a light emitting surface and a light receiving surface is known as such a technique for improving light extraction efficiency or light collecting efficiency.

For example, JP 2011-100829 A (PTL 1) discloses a method of manufacturing a semiconductor light-emitting device comprising immersing, in an aqueous solution of nitric acid, a semiconductor laminate having a light emitting layer and a surface layer which includes a $Ga_{(1-x)}Al_xAs$ layer ($0 \leq x < 0.8$) and through which light emitted from the light emitting layer is extracted, thereby roughening the surface of the surface layer. According to the technique of PTL 1, a semiconductor light-emitting device with increased light output can be manufactured by improving the efficiency of light extraction from inside the semiconductor crystal.

JP 2001-004442 A (PTL 2) discloses an infrared sensor including an infrared transmitting unit and an infrared detecting unit with the outer surface of the infrared transmitting unit being an uneven plane.

For example, a semiconductor light-emitting diode typically has a semiconductor laminate including an n-type semiconductor layer, a light emitting layer (also referred to as an active layer), and a p-type semiconductor layer, the semiconductor laminate being electrically sandwiched between a pair of electrodes. Such a semiconductor light-emitting diode is disclosed in JP 2007-258326 A (PTL 3). Specifically, the semiconductor light-emitting diode includes a conductive support substrate; a metal layer and a light emitting portion composed of an InGaAlP-based semiconductor including an n-type cladding layer, an active layer, and a p-type cladding layer on the conductive support substrate, in which a current diffusion layer is provided on the light emitting portion and a surface of the current diffusion layer opposite to the surface in contact with the light emitting portion is a light extraction surface. In the semiconductor light-emitting diode, a thin connection pattern is formed in which a first ohmic wiring electrode portion is formed between the metal layer and the light emitting portion, a pedestal electrode and a second ohmic wiring electrode portion are provided on the light extraction surface, and the pedestal electrode and the second ohmic wiring electrode portion are electrically connected.

CITATION LIST

Patent Literature

PTL 1: JP 2011-100829 A
PTL 2: JP 2001-004442 A
PTL 3: JP 2007-258326 A

SUMMARY

Technical Problem

Here, when a voltage is applied to a semiconductor light-emitting diode as described in PTL 3, light is emitted from the light emitting layer and the light is isotropically radiated in all directions. Part of such light directed toward the electrode portion on the light emission side is blocked by the electrode portion, which contributes to the reduction of light extraction efficiency. For a semiconductor light receiving device and a solar cell in which an electrode portion is provided on a light receiving surface, the electrode portion blocks incident light, which contributes to the reduction of light collecting efficiency.

With a view to improving the light extraction efficiency and light collecting efficiency of semiconductor optical devices, the present inventor focused on the line width of a wiring electrode portion of electrodes provided on the surface of a semiconductor layer. This is because when the line width of the wiring electrode portion is smaller than conventional line widths, the area of the electrode portion blocking light is reduced, in other words, in the case of a semiconductor light-emitting diode which is a light emitting semiconductor optical device, the area of the light emitting surface from which light is emitted is increased, which is considered to improve light extraction efficiency. In particular, the inventor conjectured that in a semiconductor light-emitting diode in which an intermediate electrode is formed between the metal layer and the light emitting portion, and a pad electrode and the wiring electrode portion are provided on the light emitting surface as in PTL 3; concentration of current in the peripheral portion of the electrode on the light emitting surface would increase the light output power in the peripheral portion of the electrode, and the effect of reducing the line width in improving the light extraction efficiency would be significant. Further, the inventor conjectured that the light collection efficiency of semiconductor light receiving devices and solar cells which are light receiving semiconductor optical devices would also be improved by reducing the line width of a wiring electrode portion.

The inventor fabricated a test semiconductor light-emitting diode in which the line width of the wiring electrode portion is smaller than the conventional width, and the light output power was improved as expected earlier; however, the inventor found a new problem of increased tendency of the wiring electrode portion to peel off.

To address the problem, it could be helpful to provide a semiconductor optical device with light extraction efficiency or light collecting efficiency higher than that of conventional devices and with a reduced peeling ratio of a wiring electrode portion, and a method of manufacturing the same.

Solution to Problem

The present inventor diligently studied ways to address the above challenges, focused on the structure of the wiring electrode portion including a metal layer to reduce the peeling ratio of the wiring electrode portion, and contemplated providing a protective layer which prevents the metal layer form peeling. According to the diligent studies, the inventor found that the peeling ratio of the wiring electrode portion can be significantly reduced by providing a conductive hard film as a protective layer on the metal layer. This discovery led to this disclosure.

Specifically, we propose the following features.

(1) A semiconductor optical device comprising a semiconductor layer and a wiring electrode portion on a surface of the semiconductor layer that serves as one of a light emitting surface and a light receiving surface, wherein a line width of the wiring electrode portion is 2 µm or more and 5 µm or less, the wiring electrode portion has a metal layer on the semiconductor layer and a conductive hard film on the metal layer, and the conductive hard film is harder than the metal layer.

(2) The semiconductor optical device according to (1) above, wherein a vacant space is present between a region under a peripheral portion of the wiring electrode portion and the semiconductor layer.

(3) The semiconductor optical device according to (2) above, wherein the surface of the semiconductor layer has a flat surface portion and a rough surface portion, part of the surface of the semiconductor wafer at a joint center where the surface of the semiconductor layer and the wiring electrode portion are joined to each other is the flat surface portion, and the vacant space is constituted by the rough surface portion.

(4) The semiconductor optical device according to (3) above, wherein a line width of the flat surface portion at the joint center is 1.0 µm or more.

(5) The semiconductor optical device according to (3) or (4) above, wherein at the joint center, a line width of the flat surface portion is smaller than a line width of the wiring electrode portion by 0.5 µm or more.

(6) The semiconductor optical device according to any one of (1) to (5) above, wherein a thickness of the conductive hard film is 0.4 µm or more and 1.7 µm or less.

(7) The semiconductor optical device according to any one of (1) to (6) above, wherein the conductive hard film is a nitride of one or more metal elements selected from the group consisting of Ti, Ta, Cr, W, Mo, and V.

(8) The semiconductor optical device according to any one of (1) to (7) above, wherein the semiconductor layer includes an n-type semiconductor layer, a light emitting layer, and a p-type semiconductor layer in this order, and the surface of the semiconductor layer is a surface of one of the n-type semiconductor layer and the p-type semiconductor layer.

(9) A method of manufacturing a semiconductor optical device, comprising a wiring electrode portion formation step of forming a wiring electrode portion on a surface of a semiconductor layer that serves as one of a light emitting surface and a light receiving surface, wherein a line width of the wiring electrode portion is 2 µm or more and 5 µm or less, and the wiring electrode portion formation step includes a first step of forming a metal layer on the surface of the semiconductor layer and a second step of forming a conductive hard film on the metal layer.

(10) The method of manufacturing a semiconductor optical device, according to (9) above, further comprising a vacant space formation step of forming a vacant space between a region under a peripheral portion of the wiring electrode portion and the semiconductor layer after the wiring electrode formation step.

(11) The method of manufacturing a semiconductor optical device, according to (10) above, wherein in the vacant space formation step, the surface of the semiconductor layer is wet etched to roughen a part of the surface of the semiconductor layer lying under a peripheral portion of the wiring electrode portion to form the vacant space.

Advantageous Effect

This disclosure provides a semiconductor optical device with light extraction efficiency or light collecting efficiency higher than that of conventional devices and with a reduced peeling ratio of a wiring electrode portion, and a method of manufacturing the same by providing a conductive hard film on a metal layer on a wiring electrode portion.

DETAILED DESCRIPTION

Figure 1:
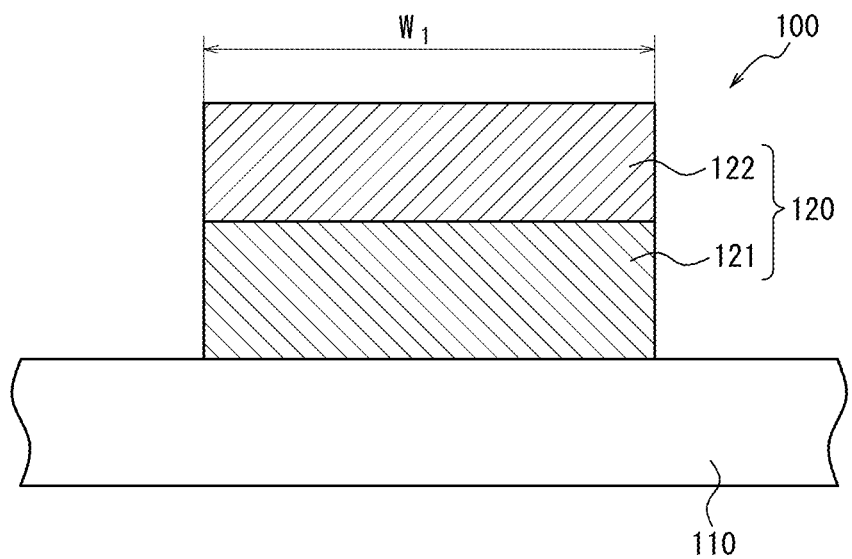
FIG. 1 is a schematic cross-sectional view illustrating a wiring electrode portion of a semiconductor optical device 100 according to a first embodiment of this disclosure in a larger scale.

Embodiments according to this disclosure will now be described in more detail with reference to the drawings. In principle, components that are common to semiconductor optical devices and semiconductor light-emitting diodes according to this disclosure are herein denoted by the same reference numerals, and thus a description thereof will not be repeated. Further, in the schematic cross-sectional views, each layer is enlarged in thickness for the sake of explanation, and the thickness ratio of the illustrated layers does not conform to the actual ratio.

First Embodiment: Semiconductor Optical Device

As illustrated in FIG. 1, in the semiconductor optical device 100 according to the first embodiment of this closure, a wiring electrode portion 120 is provided on a surface of a semiconductor layer 110 that serves as a light emitting surface or a light receiving surface. Here, the line width $W_1$ of the wiring electrode portion 120 is 2 µm or more and 5 µm or less, and the wiring electrode portion 120 has a metal layer 121 on the semiconductor layer 110 and a conductive hard film 122 on the metal layer 121. The conductive hard film 122 is harder than the metal layer 121. By employing such a structure, even when the line width $W_1$ is set to 2 µm or more and 5 µm or less which is smaller than the conventional line width, the wiring electrode portion 120 can be prevented from peeling from the surface of the semiconductor layer 110.

The wiring pattern of the wiring electrode portion 120 is not limited. As with the wiring pattern of the wiring electrode portion 120 of the semiconductor light-emitting diode 300 to be described with reference to FIG. 4B, the wiring pattern may be a polygonal line pattern. Alternatively, the wiring pattern of the wiring electrode portion 120 may be an interdigital pattern or a curved line pattern. Thus, an appropriate wiring pattern can be selected. The line width may be constant or varied within the above-mentioned range of 2 µm or more and 5 µm or less.

Figure 2:
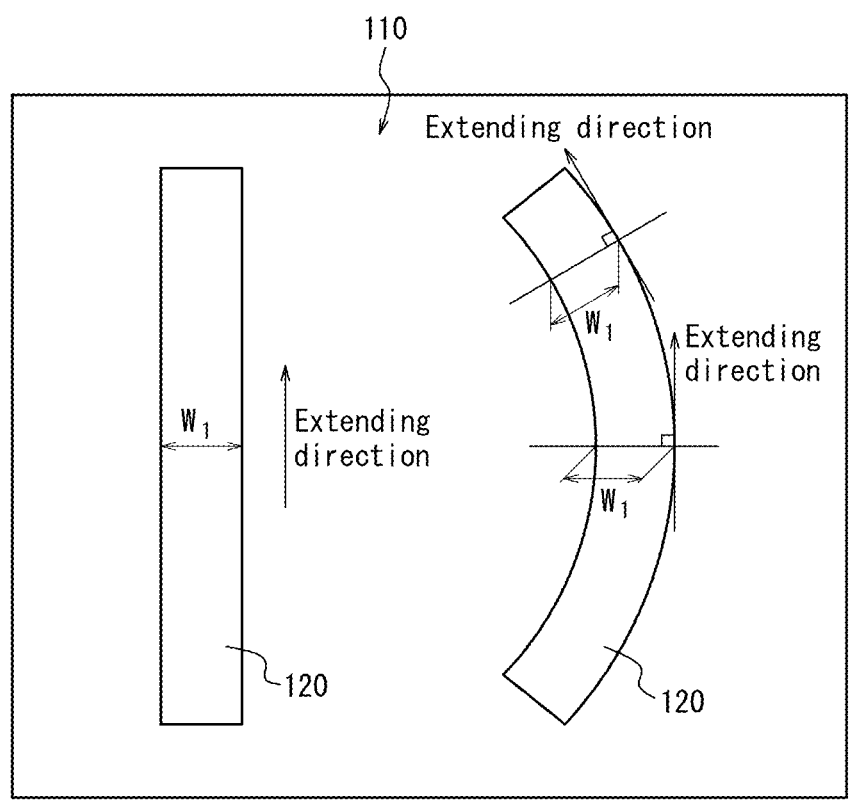
FIG. 2 is a schematic view illustrating the line width $W_1$ in this specification.

The line width $W_1$ of the wiring electrode portion 120 herein is the line width of the wiring electrode portion 120 observed from above under a metallurgical microscope or an electron microscope. Note that when measuring the line width $W_1$, the metal layer 121 and the conductive hard film 122 are not distinguished and the maximum value of the lengths in the width direction is used. Here, the width direction of the line width $W_1$ is the width direction of the wiring electrode portion 120 which is a direction perpendicular to the extending direction of the wiring electrode portion 120 in the top view of the surface of semiconductor layer 110 as illustrated in FIG. 2, and the width is the line width $W_1$. Note that when the line width of the wiring electrode portion 120 is not constant in the length direction of the wiring, the line width $W_1$ is determined using the average. Further, when part or all of the wiring pattern of the wiring electrode portion 120 includes a curved line shape, a tangential direction at a given point is defined as the extending direction, and the width specified by the length in the normal direction at the given point is determined as the line width $W_1$ of the wiring electrode portion 120. Note that in the case of a polygonal line shape, the line width $W_1$ is not defined for bent portions (for example, intersections between a plurality of straight lines or endpoints thereof), so that such a line width is excluded from the line width herein.

The metal layer 121 provided on the semiconductor layer 110 is a layer for forming a good ohmic contact with the semiconductor layer 110, and the metal material of the metal layer 121 is selected depending on the semiconductor material, the dopant, etc. of the semiconductor layer 110. The metal layer 121 may have a layered structure in which a plurality of metal materials are stacked and may contain alloys. The thickness of the metal layer 121 is typically in the range of 0.1 µm to 1 µm, and may be for example 0.6 µm to 0.9 µm. The metal layer 121 can be formed in a desired wiring pattern for example by sequentially performing photolithography and vapor deposition or sputtering.

Provided on the metal layer 121 is the conductive hard film 122. The conductive hard film 122 can also be formed in a desired wiring pattern on the metal layer 121 for example by sequentially performing photolithography and vapor deposition or sputtering. Here, the hardness of the conductive hard film 122 is higher than that of the metal layer 121. Note that the hardness herein is determined by a measurement method according to the Vickers hardness defined in "JIS Z 2244 Vickers hardness test-Test method, Japanese Industrial Standards Committee, 2009", and can be measured using for example a commercially available micro-hardness tester (MHA-400 manufactured by NEC).

Such a conductive hard film 122 can use a metal nitride and may be made of a nitride of one or more metal elements selected from the group consisting of Ti, Ta, Cr, W, Mo, and V in particular. Examples of such a metal nitride include TiN, TaN, and WN. TiN having a Vickers hardness of more than 1500 HV is particularly preferably used as the conductive hard film 122. TiN is not only hard and conductive but also excellent in wet etching characteristics, so that the material is easy to handle. Further, the reason that a metal nitride is used instead of a metal material for the conductive hard film 122 is that since a metal nitride is not only hard but fractures without being deformed, which can dampen the effect on the metal layer 121 by keeping the effect with respect to a local stress only to the fracture of the conductive hard film 122.

Here, when the line width $W_1$ is 2 µm or more and 5 µm or less, the joined width (or the joined area) between the wiring electrode portion 120 and the surface of the semiconductor layer 110 is smaller; accordingly, the bonding strength of the joined surface is considered to be lower as compared with the case where the joined width is large. In this embodiment, the conductive hard film 122 is provided on the metal layer 121, so that the wiring electrode portion 120 can be prevented from being peeled from the surface of the semiconductor layer 110. The inventor believes that the peeling can be prevented because of the following reasons.

First, the wiring electrode portion 120 is considered to be peeled from the surface of the semiconductor layer 110 when external forces are applied to the wiring electrode portion in a lateral direction (transverse direction). Note that such external forces in the lateral direction are developed in each stage of the manufacturing, inspection, and delivery of the semiconductor optical device 100. Examples of the causes of the external forces include water flows for washing the semiconductor optical device 100, blows (air flows) for drying the device, bonding of the device to a transfer adhesive sheet, and the like. Here, since the conductive hard film 122 in this embodiment is harder than the metal layer 121, the metal layer 121 can be prevented from being deformed by external forces. Accordingly, force components of the external forces in directions contributing to the peeling of the wiring electrode portion 120 are reduced, which is considered to reduce the ratio of the wiring electrode portion 120 that peels in the end (that is, the peeling ratio).

Figure 3A:
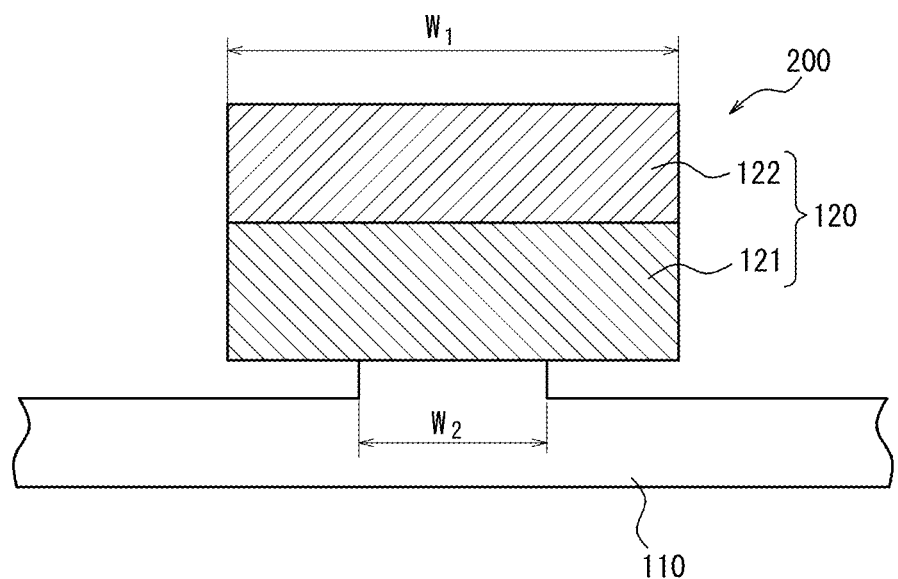
FIGS. 3A and 3B are schematic cross-sectional views illustrating respective wiring electrode portions of semiconductor optical devices 200 and 200' according to the first embodiment in a larger scale.

As illustrated in FIG. 3A, in the semiconductor optical device 200, a vacant space is preferably present between a region under a peripheral portion of the wiring electrode portion 120 and the semiconductor layer 110. In this case, the advantageous effect of this disclosure is significant. In FIG. 3A, the peripheral portion of the wiring electrode portion 120 is not in contact with the semiconductor layer 110 and the peripheral portion of the wiring electrode portion 120 protrudes like eaves of a building above the surface of the semiconductor layer 110. When the wiring electrode portion is not in contact with the semiconductor layer 110 and a vacant space is present, if the above-mentioned external forces are applied, the wiring electrode portion is easily deformed in the directions in which the force components contributing to peeling are increased, meanwhile the conductive hard film 122 inhibits the deformation of the wiring electrode portion 120. Thus, the advantageous effect (that is, prevention of peeling) achieved using the conductive hard film 122 is more significant in the semiconductor optical device 200 in which a vacant space as described above is present. Note that the "vacant space" between a region under a peripheral portion of the wiring electrode portion 120 and the semiconductor layer 110 herein refers to a vacant space (hollow) open (in other words, connected) to the outside in directions away from the wiring electrode portion 120, excluding a closed space.

In this embodiment, the thickness of the conductive hard film 122 is not limited; however, in terms of ensuring the above effect, the thickness of the conductive hard film 122 is preferably 0.4 μm or more and 1.7 μm or less, more preferably 0.7 μm or more and 1.5 μm or less, most preferably 0.9 μm or more and 1.2 μm or less. A thickness of 0.4 μm or more ensures the wiring electrode portion 120 as a whole to be strong enough to prevent the deformation thereof due to the above-mentioned external forces. A thickness of 1.7 μm or less can reduce the area to which the external forces are applied in the lateral direction developed as the thickness of the wiring electrode portion 120 itself increases. Note that the conductive hard film 122 may cover the sides of the metal layer 121, in which case, the thickness is determined by the height from the upper surface of the metal layer 121 to the top of the conductive hard film 122.

Figure 3B:
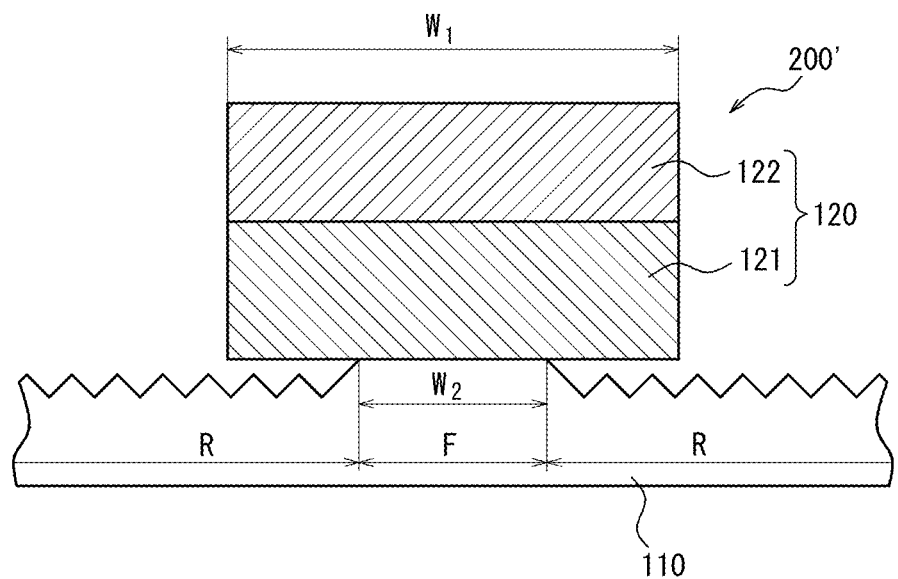

As illustrated in FIG. 3B, in the semiconductor optical device 200' according to one aspect of this embodiment, the surface of the semiconductor layer 110 may include flat surface portion F and a rough surface portion R. While part of the surface of the semiconductor wafer 110 at a center of a region where the surface of the semiconductor layer 110 and the wiring electrode portion 120 are joined to each other (hereinafter also referred to as "joint center") is the flat surface portion F, the vacant space can be constituted by the rough surface portion R. In this case, the line width $W_2$ of the part of the flat surface portion F where the surface of the semiconductor layer 110 is joined to the wiring electrode portion 120 is smaller than the line width $W_1$ of the wiring electrode portion 120. Further, a part corresponding to $[W_1-W_2]$ is the part of the wiring electrode portion 120 which protrudes like an eave as described above. In the semiconductor optical device 200', a part of the surface of the semiconductor layer 110 lying under the peripheral portion of the wiring electrode portion 120 is the rough surface portion R. Specifically, the surface of the semiconductor layer 110 is the rough surface portion R below the vacant space under the "eave" of the peripheral portion of the wiring electrode portion 120. In the semiconductor optical device 200', when the line width $W_1$ is 2 μm or more and 5 μm or less, peeling easily occurs; meanwhile, providing the conductive hard film 122 significantly prevents the wiring electrode portion 120 in the semiconductor optical device 200' from peeling.

Here, even if the wiring electrode portion 120 includes the metal layer 121 and the conductive hard film 122 covering the sides of the metal layer 121, the vacant space preferably extends to the region under the peripheral portion of the metal layer 121 (in other words, the vacant space is preferably present between the region under the peripheral portion of the metal layer 121 and the semiconductor layer 110). In terms of improving the light output power, for example, when the semiconductor optical device 100 is a light emitting device, the rough surface portion R of the semiconductor layer 110 preferably extends to the region under the peripheral portion of the metal layer 121. Note that the area of the vacant space and the rough surface portion R can be checked by observing a cross section of the wiring electrode portion 120 using a metallurgical microscope or an electron microscope.

The surface profile of the semiconductor layer 110 of the semiconductor optical device 200' can be obtained, for example, in the following manner. That is, the semiconductor layer 110 is first formed by epitaxial growth using MOCVD or the like, and the metal layer 121 and the conductive hard film 122 are then formed sequentially by photolithography and vapor deposition, sputtering, etc., thereby forming the wiring electrode portion 120. After that, when the surface of the semiconductor layer 110 is wet etched by being immersed in nitric acid or the like, in addition to the exposed surface of the surface of the semiconductor layer 110, the region under the peripheral portion of the wiring electrode portion 120 is also etched; thus, the rough surface portion R is formed. Note that the method of forming the vacant space constituted by the thus provided rough surface portion R is merely an example, and the vacant space can naturally be formed by a different method.

In this case, the line width $W_2$ of the flat surface portion F at the joint center where the wiring electrode portion 120 and the surface of the semiconductor layer 110 are joined to each other is preferably 1.0 μm or more. This is to ensure a sufficient joined area between the wiring electrode portion 120 and the semiconductor layer 110, and in this respect, the line width $W_2$ is preferably 2.0 μm or more.

Further, at the joint center, the line width $W_2$ of the flat surface portion F is preferably smaller than the line width $W_1$ of the wiring electrode portion 120 by 0.5 μm or more. Specifically, it is preferable that $W_1-W_2 \geq 0.5$ (μm) is satisfied. This is to increase the rough surface portion R in the light emitting surface or light receiving surface of the semiconductor optical device 200, and in this respect, it is more preferable that $W_1-W_2 \geq 1.0$ (μm) is satisfied.

The semiconductor optical devices 100 and 200 can be used for various applications. For example, when the semiconductor layer 110 includes a light emitting layer, the semiconductor optical devices 100, 200 can serve as semiconductor light-emitting diodes. More specifically, when the semiconductor layer 110 includes an n-type semiconductor layer, a light emitting layer, and a p-type semiconductor layer, and the surface of the semiconductor layer 110 is a surface of the n-type surface semiconductor layer or the p-type semiconductor layer; the semiconductor optical devices 100, 200 operate as semiconductor light-emitting diodes. On the other hand, when the semiconductor layer 110 includes a light receiving layer, the semiconductor optical devices 100, 200 can serve as light receiving devices or solar cells. Known techniques can be applied to the layer structure of the semiconductor layer 110, the material of each layer of the semiconductor layer 110, the dopant and the dopant concentration for each layer of the semiconductor layer 110, and the like. Although not shown in FIGS. 1 and 3, the semiconductor optical device 100 may have a metal layer, an insulating layer, and a reflective layer, a support substrate, etc. depending on use under the semiconductor layer 110.

A method of manufacturing the semiconductor optical device 100 according to the first embodiment of this disclosure includes a wiring electrode portion formation step of forming the wiring electrode portion 120 on a surface of the semiconductor layer 110 that serves as a light emitting surface or a light receiving surface. The line width $W_1$ of the wiring electrode portion 120 is 2 μm or more and 5 μm or less, and the wiring electrode portion formation step includes a first step of forming the metal layer 121 on the surface of the semiconductor layer 110 and a second step of forming the conductive hard film 122 on the metal layer 121. The method preferably includes a vacant space formation step of forming a vacant space between a region under a peripheral portion of the wiring electrode portion 120 and the semiconductor layer 110 after the wiring electrode formation step. Preferably, in the vacant space formation step, the surface of the semiconductor layer 110 is wet etched to roughen a part of the surface of the semiconductor layer 110 lying under a peripheral portion of the wiring electrode portion 120 to form the vacant space. Thus, the above-described rough surface portion R can be formed. These steps will be described in more detail in the third embodiment below.

Second Embodiment: Semiconductor Light Emitting Diode

Figure 4A:
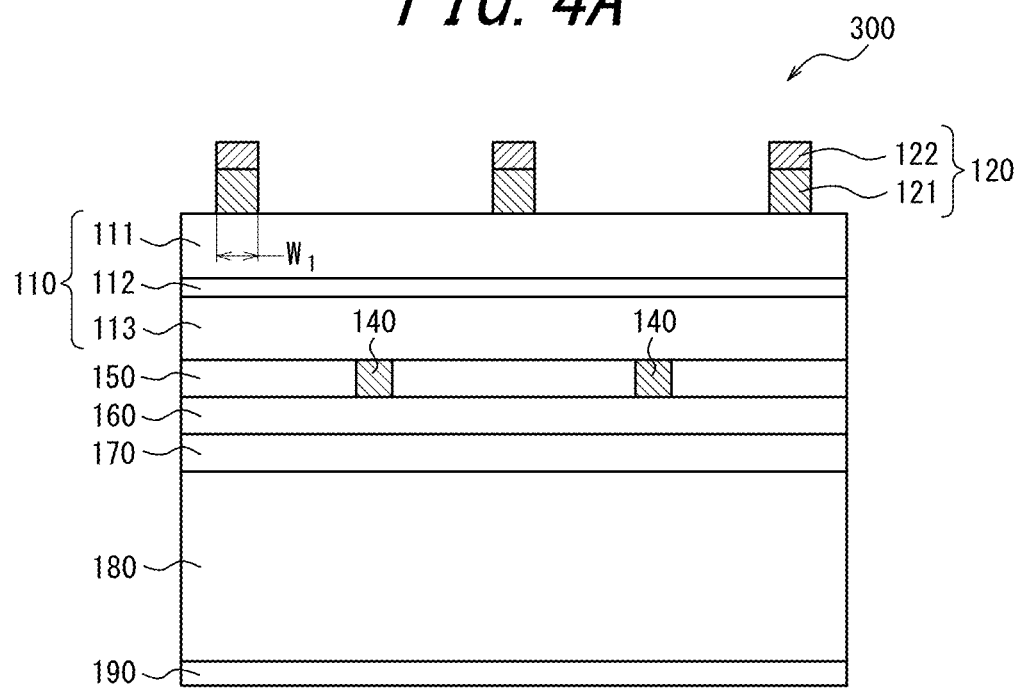
FIG. 4A is a schematic cross-sectional view illustrating a semiconductor light-emitting diode 300 according to a second embodiment of this disclosure.
Figure 4B:
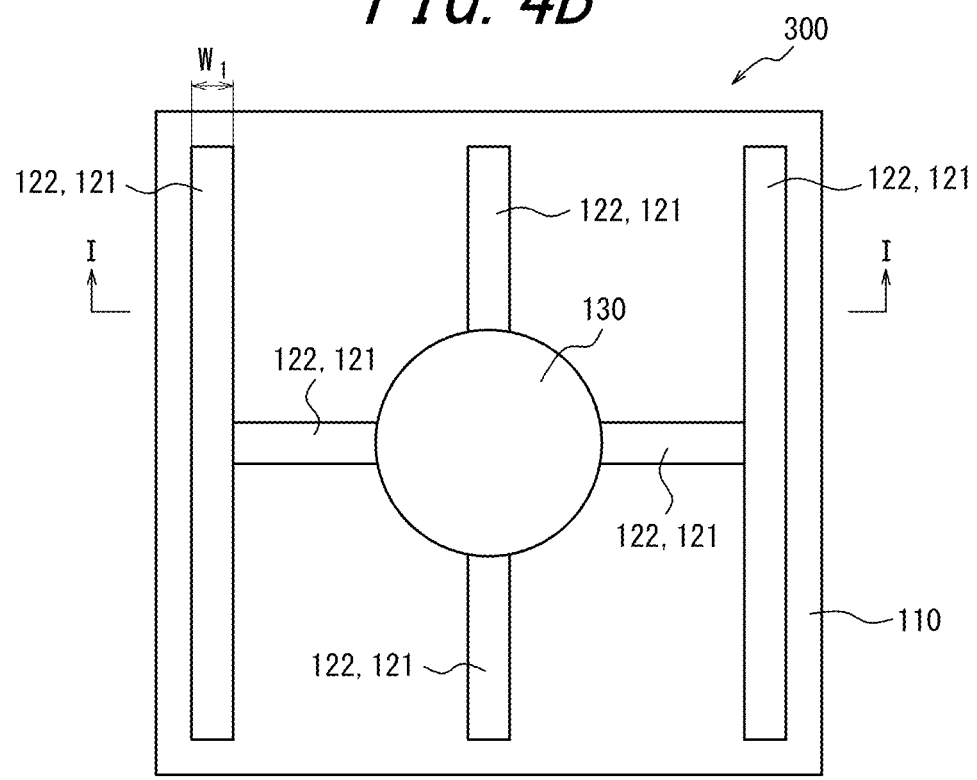
FIG. 4B is a top view of the semiconductor light-emitting diode 300 depicted in FIG. 4A.

Next, a semiconductor light-emitting diode 300 according to the second embodiment of this disclosure is specifically described as a concrete example of the semiconductor optical device 100, with reference to FIGS. 4A and 4B. FIG. 4A is a cross-sectional view taken along line I-I in FIG. 4B. Further, as described above with respect to the semiconductor optical device 200, the surface of the semiconductor layer 110 is preferably roughened in terms of improving the light emission efficiency; however, the rough surface portion R is not shown in FIG. 4 for brevity.

As illustrated in FIGS. 4A and 4B, the semiconductor light-emitting diode 300 according to the second embodiment of this disclosure has a support substrate 180, a metal joint layer 170 on the support substrate 180, a reflective layer 160 on the metal joint layer 170, a mixed layer of an ohmic electrode 140 and an insulating film 150 on the reflective layer 160, a semiconductor layer 110 including a p-type semiconductor layer 113, a light emitting layer 112, and an n-type semiconductor layer 111 in this order, and a wiring electrode portion 120 including a metal layer 121 and a conductive hard film 122 provided on the surface of the n-type semiconductor layer 111. The wiring electrode portion 120 is formed in a pattern illustrated in the top view in FIG. 4B. Further, a circular pad electrode 130 is provided in the center area of the semiconductor light-emitting diode 300 on the n-type semiconductor layer 111 side. A lower electrode 190 may be provided on the rear surface of the support substrate 180. Light is collected from the semiconductor light-emitting diode 300 in a direction toward the wiring electrode portion 120 (upward in FIG. 4A).

Examples of a suitable material forming the support substrate 180 include semiconductor materials such as Si, GaAs, and Ge, metals such as Al and Cu or alloy materials thereof. The support substrate 180 preferably has a thickness of 100 μm to 300 μm.

Examples of a suitable material forming the metal joint layer 170 include Au, and the metal layer preferably has a thickness of 0.5 μm to 3.0 μm.

The reflective layer 160 reflects part of light emitted from the light emitting layer 112 toward the support substrate 180 thus increasing the light extraction efficiency. The reflective layer 160 desirably has high reflectance with respect to the dominant wavelength of the light emitted from the light emitting layer 112, and the reflectance is preferably 60% or more with respect to light having a wavelength in the range of 300 nm to 1100 nm. Examples of a suitable material forming the reflective layer 160 include gold (Au), aluminum (Al), or silver (Ag) alone, alloys containing them as constituent elements, or a laminate thereof. The reflective layer 160 preferably has a thickness of 100 nm to 1000 nm. Generally, gold (Au) and silver (Ag) have low adhesiveness to an insulator and easily peel when they are used directly. With this being the case, it is known that the adhesiveness can be improved by placing an adhesion layer of Cr, Ti, Mo, etc. under the reflective layer 160. However, since the adhesion layer of these materials have low reflectance, the thickness of the layer is set to be as small as, for example, approximately 10 nm so that light can transmit the layer.

The ohmic electrode 140 is an electrode for forming a good ohmic contact with the p-type semiconductor layer 113. Examples of a material forming the ohmic electrode 140 include AuZn, and AuBe, and the ohmic electrode 140 preferably has a thickness of 100 nm to 500 nm.

The insulating film 150 can use any insulating material which can transmit light emitted from the light emitting layer 112 and let the light reach the reflective layer 160. The insulating film 150 desirably has high transmissivity with respect to the dominant wavelength of the light emitted from the active layer, and the transmissivity is preferably 80% or more with respect to light having a wavelength in a range of 300 nm to 1100 nm. Examples of a suitable material of the insulating film 150 include SiN, $SiO_2$, and AlN, and the insulating film 150 preferably has a thickness of 100 nm to 500 nm.

Examples of suitable materials forming the layers of the semiconductor layer 110 include compound semiconductors, such as III-V compound semiconductors. For the III-V compound semiconductors, for example, the n-type semiconductor layer 111 and the p-type semiconductor layer 113 can use an AlGaAs-based material, an AlGaInP-based material, an AlGaN-based material, etc. Examples of p-type impurities include Mg, Zn, and C, whereas examples of n-type impurities include Si, Te, and Se. The light emitting layer 112 can be formed from a single layer of an AlGaAs-based material, an AlGaAsInP-based material, an AlGaN-based material, or the like, or can have a layered structure such as a multiple quantum well. Each of them can be formed by epitaxial growth using a known technique such as MOCVD. The emission wavelength can be set in a range of 300 nm to 1100 nm. As for the thickness of each layer, for example, the n-type semiconductor layer 111 may have a thickness of 1 μm to 10 μm, the light emitting layer 112 may have a thickness of 10 nm to 500 nm, the p-type semiconductor layer 113 may have a thickness of 1 μm to 10 μm. This embodiment has described the semiconductor layer 110 in which the n-type semiconductor layer is on the light emitting surface side; however, the disclosure is not limited to this. The p-type and n-type layers can, of course, be switched in the order.

The metal layer 121 and the conductive hard film 122 of the wiring electrode portion 120 are as described in the first embodiment. The metal layer 121 is an electrode for forming a good ohmic contact with the n-type semiconductor layer 111. As for the materials of such a metal layer 121, for example, the electrode can be an AuGe/Ni/Au electrode in which AuGe, Ni, and Au are sequentially formed and the electrode preferably has a thickness of 100 nm to 1000 nm.

In the semiconductor light-emitting diode 300 of this embodiment, as illustrated in FIG. 4B, the pad electrode 130 is preferably formed directly on part of the conductive hard film 122. Wire bonding is performed on the pad electrode 130. Although the pad electrode 130 is provided in the center in FIG. 4B, the position of the pad electrode 130 can be determined depending on the wiring pattern of the wiring electrode portion 120. As will be described, the conductive hard film 122 under the pad electrode and the conductive hard film 122 of the wiring electrode portion 120 can be formed at the same time, in which case, although not shown, the conductive hard film 122 under the pad electrode and the conductive hard film 122 of the wiring electrode portion have the same height.

Regarding suitable materials of the pad electrode 130, the top layer is made of, for example, Al, Au materials used for a Au wire, and the pad electrode 130 is preferably a Ti/Au electrode in which Au is formed on Ti as a adhesion layer in order. The Ti layer has a thickness of 50 nm to 200 nm so that it can serve as an adhesion layer. The Au layer preferably has a thickness of 1 μm to 3 μm.

The materials of the lower electrode 190 are selected from materials which forms an ohmic contact with the support substrate 180. For example, when n-type GaAs is selected as the material of the support substrate, the lower electrode 190 may be a stack of AuGe/Ni/Au. When a metal substrate is used as the support substrate 180, it is also possible to select a structure without a lower electrode.

Although not shown, in the semiconductor light-emitting diode 300, a light transmitting insulating layer on the semiconductor layer 110 and a reflective layer placed on the light transmitting insulating layer are preferably provided between the semiconductor layer 110 and the conductive hard film 122 under the pad electrode 130. The light transmitting insulating layer serves as a current blocking layer. In this case, an opening can be provided in the metal layer 121 under the pad electrode 130 and the metal layer 121 can be provided to surround the light transmitting insulating layer and the reflective layer.

In this case, the light transmitting insulating layer is preferably made of a material having a transmissivity of 80% or more with respect to light having a wavelength in a range of 300 nm to 1100 nm. Examples of a suitable material of the light transmitting insulating layer include SiN, SiO$_2$, and AlN. The light transmitting insulating layer preferably has a thickness of 100 nm to 500 nm.

Further, the reflective layer reflects part of light emitted from the light emitting layer 112 toward the pad electrode 130; thus, the reflective layer is suitable in terms of increasing the light extraction efficiency. The reflective layer preferably has a reflectance of 60% or more with respect to light having a wavelength in a range of 300 nm to 1100 nm. Examples of a suitable material forming the reflective layer include gold (Au) or a gold alloy material, platinum (Pt), aluminum (Al), silver (Ag) alone; an alloy containing them as constituent elements; and a laminate made thereof. As a suitable example for a near-infrared wavelength region, a Cr/Au electrode in which Au having a reflectance of 90% or more with respect to the wavelength region is provided on a thin adhesion layer of Cr may be used. Preferably, the Cr layer which is a contact member has a thickness of 5 nm to 20 nm, and the Au layer which is a reflective member has a thickness of 100 nm to 1000 nm. The light transmitting insulating layer and the reflective layer can be formed by photolithography and sputtering, plasma-enhanced CVD, electron beam deposition, vapor deposition resistance heating, etc.

Note that in the method of measuring film thicknesses in this specification, a stylus profilometer is used, and a film thickness is found from the mean value of the measured values of five points in the wafer surface (in the case of a 3-inch substrate in Examples of this disclosure, the five points are on a diagonal line passing through the wafer center and the points are provided at a regular interval such that two of the points are end points at positions 1 cm inside the perimeter of the wafer, and the rest are between the two points).

Third Embodiment: Method of Manufacturing Semiconductor Light Emitting Diode

Next, an example of a method of manufacturing a semiconductor light emitting diode 400 according to the third embodiment will be described with reference to FIG. 5. First, as illustrated in Step (A) of FIG. 5, a semiconductor layer 110 is formed on a growth substrate G such as a GaAs substrate. The semiconductor layer 110 is formed by epitaxially growing an n-type semiconductor layer 111, a light emitting layer 112, and a p-type semiconductor layer 113 that are made of materials as described above, in this order, for example, by MOCVD.

Figure 5:
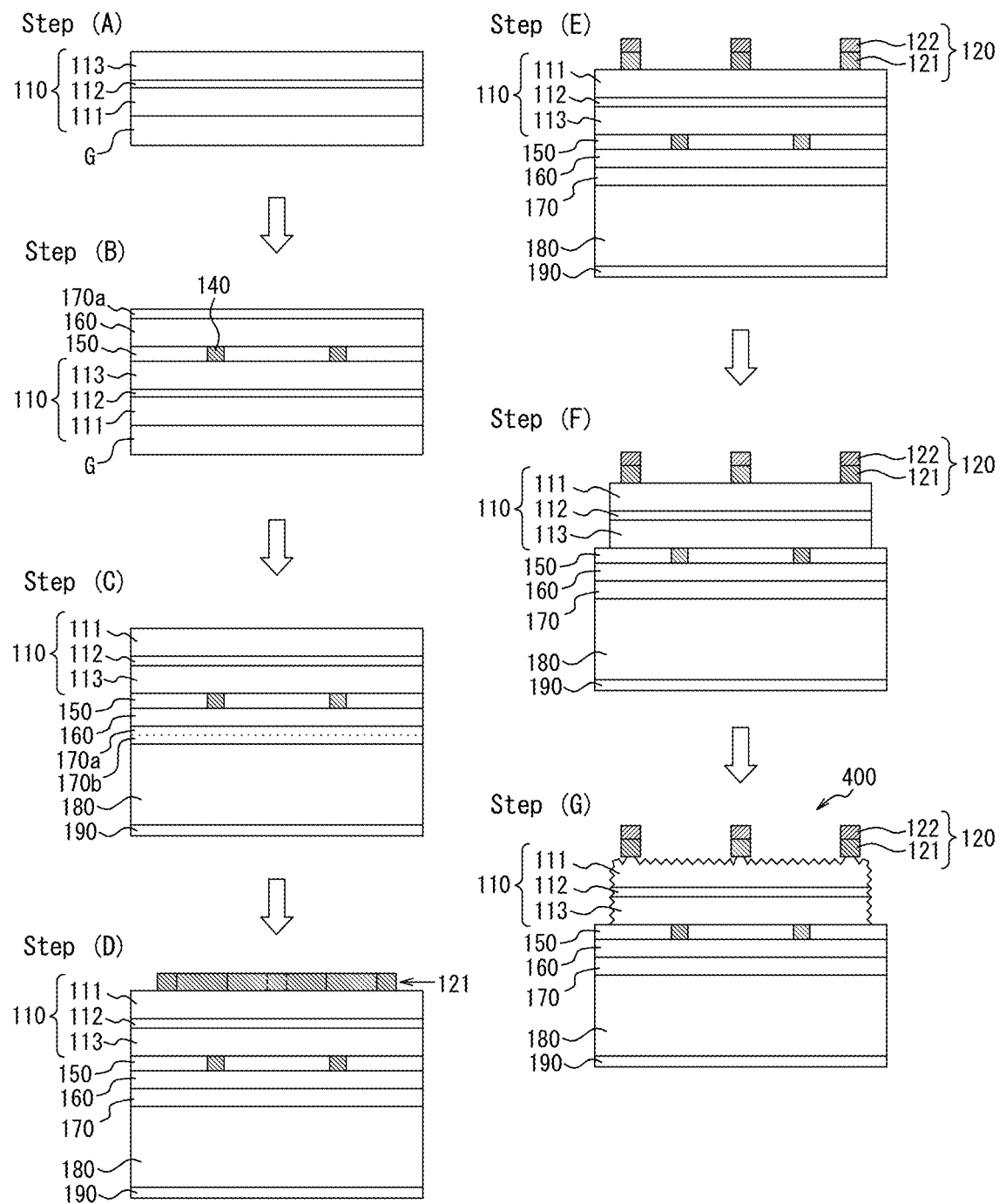
FIG. 5 is a schematic cross-sectional views illustrating an example manufacturing process of a semiconductor light-emitting diode 400 according to a third embodiment of this disclosure.

Next, as illustrated in Step (B) of FIG. 5, an ohmic electrode 140 having a predetermined pattern is formed on the semiconductor layer 110. For example, the materials described above are deposited by vapor deposition using resistance heating or electron beam deposition, and a resist pattern is formed by photolithography. The deposited film is then etched to form the predetermined pattern. Subsequently, the film is subjected to contact annealing (rapid thermal annealing: RTA). After that, an insulating film 150 is formed on part of the semiconductor layer 110 on which the ohmic electrode is not formed. This structure can be obtained by forming, for example, the above materials by plasma-enhanced CVD, sputtering, or the like. After that, a resist pattern having openings only at portions corresponding to the ohmic electrode is formed by photolithography, and the insulating film is wet etched using a certain etchant, thereby forming openings allowing for current flow in the insulating film. A reflective layer 160 is then formed, for example, by sputtering or the like. For example, Au or the like is formed as a first metal joint layer 170a (joint layer on the semiconductor layer side) on the reflective layer 160 by a method such as vapor deposition.

Next, as illustrated in Step (C) of FIG. 5, a support substrate 180, the rear surface of which is provided with a lower electrode 190 while the front surface of which is provided with a first metal joint layer 170b (joint layer on the support substrate side) is bonded to the substrate illustrated in Step (B) of FIG. 5. Specifically, the first metal joint layer 170a and the second metal joint layer 170b are bonded and heated; thus, the two substrates are joined to each other with the metal joint layer 170. Note that the second metal joint layer 170b can be formed on the support substrate 180 by a similar method as the first metal joint layer 170a. The lower electrode 190 is formed on the support substrate 180 depositing the material described above, for example by sputtering or electron beam deposition. The formation of the lower electrode 190 may be carried out after the formation of the electrode 130 to be described.

After that, the growth substrate G is ground, and further etched to remove the growth substrate G.

Next, as illustrated in Step (D) of FIG. 5, a metal layer 121 having a predetermined pattern is formed on the semiconductor layer 110. For example, the materials described above are deposited for example by vapor deposition using resistance heating, and a resist pattern is formed by photolithography. The deposited film is then etched to form a predetermined pattern. Subsequently, the film is subjected to contact annealing (rapid thermal annealing: RTA). It should be noted that "vapor deposition using resistance heating" herein refers to a method in which vapor deposition is performed by heating of a metal under vacuum and subsequent evaporation thereof. In this method, in order to heat the metal to be vapor deposited, a current is applied to a stage made of a material having a high melting point (for example, a wire or a boat made of tungsten), thereby heating the stage to a high temperature with the heat produced by metal resistance.

Next, as illustrated in Step (E) of FIG. 5, a conductive hard film 122 is formed on the metal layer 121. Specifically, a resist pattern is formed by photolithography and a conductive hard film 122 is formed by sputtering or the like.

Although not shown, a pad electrode 130 may be formed on a predetermined position of the conductive hard film 122, for example, by sputtering, electron beam deposition, vapor deposition by resistance heating, or the like. In this case, parts of the conductive hard film and the pad electrode with remnant resist may be removed by lift-off after the deposition.

Next, as illustrated in Step (F) of FIG. 5, after forming a mesa pattern, dicing is performed. Subsequently, as illustrated in Step (G) of FIG. 5, wet etching is performed by immersion in nitric acid or the like, thereby roughening the surface of the semiconductor layer 110. The line width $W_2$ described above with reference to FIG. 3 can be controlled by changing the kind of etchant, the etching time, etc. As described above, an LED device using the semiconductor light-emitting diode 400 can be fabricated.

The semiconductor light emitting diodes 300, 400 each of which is a wafer bonded LED device and a manufacturing method thereof have been heretofore described as embodiments of this disclosure; however, this disclosure is not limited to wafer bonded LED devices. Further, each of the above embodiments is only an example of representative embodiments, and this disclosure is not limited to those embodiments. As described above, the semiconductor light-emitting diodes 300, 400 are only concreate examples of the semiconductor optical devices 100, 200. Accordingly, those skilled in the art can readily understand that the semiconductor optical devices 100, 200 can be applied to semiconductor light receiving devices and solar cells.

EXAMPLES

The disclosed method of manufacturing a semiconductor optical device will be described in more detail below using examples. However, this disclosure is not limited to the following examples.

Example 1

A semiconductor light-emitting diode was fabricated as a semiconductor optical device according to this disclosure by the method illustrated in FIG. 5. First, a semiconductor layer consisting of an n-type semiconductor layer (thickness: 7.5 μm, AlGaAs material), a light emitting layer (total thickness: 50 nm, AlGaInAs material), and a p-type semiconductor layer (thickness: 2 μm, AlGaAs material) was formed on a growth substrate made of a GaAs material by MOCVD. Next, AuZn (thickness: 200 nm) was deposited on the p-type semiconductor layer by vapor deposition using resistance heating, was patterned by photolithography, and was subjected to contact annealing at 420° C., thereby forming an ohmic electrode. After that, a transparent insulating film made of $SiO_2$ was formed by plasma-enhanced CVD on part of the p-type semiconductor layer where the ohmic electrode was not formed. Subsequently, a reflective layer (thickness: 750 nm, Au material) was formed by electron beam deposition. Further, Ti/Au (thickness: 100 nm/1 μm) was deposited thereon as a joint layer on the semiconductor layer side by vapor deposition.

In addition, an ohmic electrode (thickness: 200 nm, AuGe/Ni/Au materials) was formed on one side of a support substrate made of a GaAs material by vapor deposition by resistance heating. Further, Ti/Au (thickness: 100 nm/1 μm) was deposited as a joint layer on the support substrate side by electron beam deposition. The joint layer on the semiconductor layer side and the joint layer on the support substrate side were bonded to each other and heated at 350° C. for 30 min, thereby joining them together. After that, the growth substrate was ground to be thin, and then etched with an etchant containing ammonia, a hydrogen peroxide solution, and water. Thus, the growth substrate was completely removed.

Next, resist was formed by photolithography on the n-type semiconductor layer exposed by the removal of the growth substrate but not on the part of the wiring pattern in FIG. 4B; AuGe/Ni/Au (total thickness: 0.8 μm) was deposited by vapor deposition using resistance heating; and the resist was removed by lift-off, thereby forming a metal layer 121 having the wiring pattern illustrated in FIG. 4B. The line width of the metal layer 121 (that is, the line width $W_1$ of the wiring electrode portion) here was 4.0 μm. After that, resist was newly formed by photolithography in an area other than the part of the wiring pattern in FIG. 4B, and a pure Ti target (purity: 3N, available from CHEMISTON, Ltd.) was sputtered in a nitrogen gas-containing Ar gas atmosphere ($N_2$: 35.1 sccm, Ar: 94.9 sccm) at room temperature using a sputtering system (SPS-703 manufactured by Canon Tokki Corporation, DC magnetron; output: 4 kW), and the resist was removed by lift-off, thereby forming a conductive hard film 122 (thickness: 0.90 μm, TiN material) having the wiring pattern in FIG. 4B on the metal layer 121. The deposited TiN was analyzed by ESCA (Electron Spectroscopy for Chemical Analysis) and was found to be a gold colored TiN film having a Ti:N ratio of 1:1. After that, a resist pattern was formed by photolithography in an area other than the center part in FIG. 4B, and a pad electrode (thickness: 100 nm/1.5 μm, Ti/Au materials) was deposited by electron beam deposition. Subsequently, the pad electrode was formed using the lift-off process by which the resist was removed. Next, after patterning by photolithography, etching was performed using a mixed solution of phosphoric acid and a hydrogen peroxide solution, thereby forming a mesa pattern. In addition, Ti/Au (thickness: 10 nm/200 nm) was formed as a rear surface electrode on the rear surface of the support substrate by electron beam deposition, and both electrodes on the n-type semiconductor layer and the rear surface were simultaneously subjected to contact annealing. Finally, dicing was performed, and wet etching was performed by immersion in nitric acid, thereby roughen the semiconductor layer. Thus, the semiconductor light-emitting diode (LED device) of Example 1 was fabricated.

A cross section of the wiring electrode portion of the semiconductor light-emitting diode of Example 1 was observed under an optical microscope, and the rough surface portion R was observed. A vacant space was found to be formed between the peripheral portion of the electrode wiring portion and the semiconductor layer. Further, ten semiconductor light-emitting diodes were observed in the same manner. It was found that the line width $W_2$ of the flat surface portion F (in other words, line width before roughening) was in the range of 1.0 µm to 3.0 µm in each device, and the average was 2.0 µm. Note that the line width $W_2$ was measured in the same manner also in Examples 2, 3, Comparative Examples 1, 2, and Conventional Examples 1, 2 described below. Further, [$W_1$-$W_2$] was in the range of 1.0 µm to 3.0 µm. Note that the emission wavelength of the LED devices was 950 nm. Furthermore, the size of each support substrate after dicing was 320 µm square, and the size of each semiconductor layer was 300 µm square.

Example 2

Semiconductor light-emitting diodes of Example 2 were fabricated in the same manner as in Example 1 except that the thickness of the conductive hard film was changed from 0.9 µm to 0.5 µm.

Example 3

Semiconductor light-emitting diodes of Example 3 were fabricated in the same manner as in Example 1 except that the thickness of the conductive hard film was changed from 0.9 µm to 1.5 µm.

Comparative Example 1

Semiconductor light-emitting diodes of Comparative Example 1 were fabricated in the same manner as in Example 1 except that the thickness of the conductive hard film was changed from 0.9 µm to 1.9 µm.

Comparative Example 2

Semiconductor light-emitting diodes of Comparative Example 2 were fabricated in the same manner as in Example 1 except that the conductive hard film was not formed.

Conventional Example 1

Semiconductor light-emitting diodes of Conventional Example 1 were fabricated in the same manner as in Comparative Example 1 except that the line width $W_1$ of the wiring electrode portion was changed from 4.0 µm to 8.0 µm, and the line width $W_2$ of the flat surface portion was changed from the range of 1.0 µm to 3.0 µm to a range of 10.0 µm to 14.0 µm. Note that in Conventional Example 1, the line width $W_2$ of the flat surface portion was larger than the line width $W_1$ of the wiring electrode portion.

Conventional Example 2

Semiconductor light-emitting diodes of Conventional Example 2 were fabricated in the same manner as in Conventional Example 1 except that the line width $W_2$ of the flat surface portion was changed from the range of 10.0 µm to 14.0 µm to a range of 5.0 µm to 7.0 µm.

Fabrication conditions for Examples 1 to 3, Comparative Examples 1, 2, and Conventional Examples 1, 2 above are given in Table 1. Table 1 also presents the evaluation results to be described.

TABLE 1

| | Manufacturing conditions | | | Evaluation results | | |
|---|---|---|---|---|---|---|
| | $W_1$: Line with of wiring electrode portion (µm) | $W_2$: Line width of flat surface portion (µm) | Thickness of conductive hard film (µm) | Light output power (mW) | Forward voltage (V) | Peeling ratio of wiring electrode portion (%) |
| Example 1 | 4.0 | 1.0-3.0 | 0.9 | 7.6 | 1.28 | 5 |
| Example 2 | 4.0 | 1.0-3.0 | 0.5 | 7.6 | 1.28 | 52 |
| Example 3 | 4.0 | 1.0-3.0 | 1.5 | 7.6 | 1.28 | 24 |
| Comparative Example 1 | 4.0 | 1.0-3.0 | 1.9 | 7.6 | 1.28 | 100 |
| Comparative Example 2 | 4.0 | 1.0-3.0 | — | 8.0 | 1.30 | 100 |
| Conventional Example 1 | 8.0 | 10.0-14.0 | — | 6.7 | 1.27 | 5 |
| Conventional Example 2 | 8.0 | 5.0-7.0 | — | 6.8 | 1.28 | 5 |

<Evaluation 1: Light Output Power and Forward Voltage>

The forward voltage Vf at a current of 20 mA supplied to each of the semiconductor light emitting diodes obtained in Examples 1 to 3, Comparative Examples 1, 2, and Conventional Examples 1, 2 using a constant current voltage power supply was measured, and the light output power Po thereof was measured using an integrating sphere. The intermediate values of the measurement results of ten samples each are given in Table 1.

<Evaluation 2: Peeling Ratio of Wiring Electrode Portion>

Figure 6:
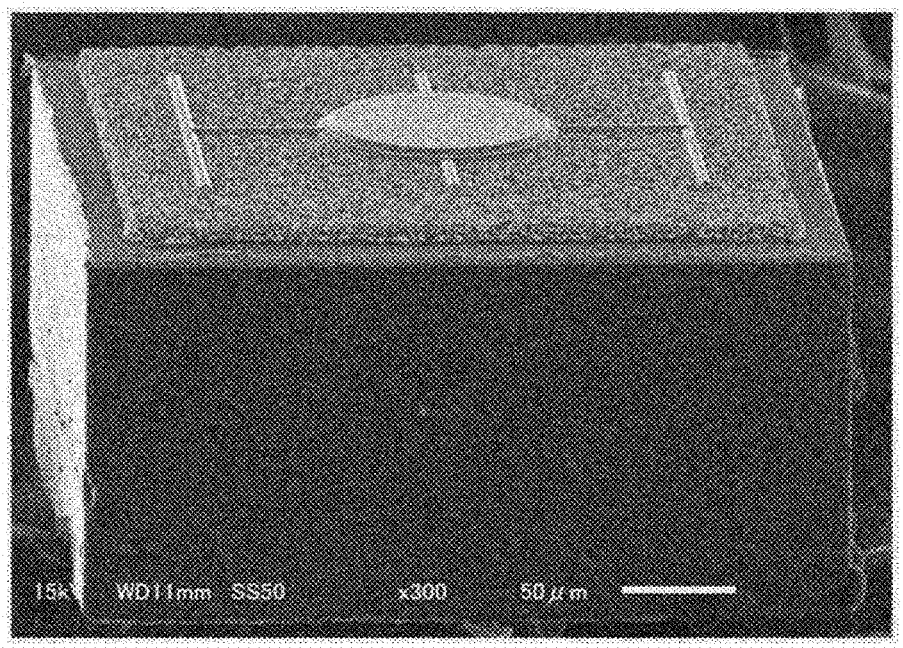
FIG. 6 is a micrograph of an example of semiconductor light-emitting diodes of Examples.

Load tests were performed under the following conditions to measure the tendency of peeling of the wiring electrode portion in Examples 1 to 3, Comparative Examples 1, 2, and Conventional Examples 1, 2. First, a load was applied to the wiring electrode portion of each semiconductor light-emitting diode of Examples 1 to 3, Comparative Examples 1, 2, and Conventional Examples 1, 2 using adhesive tape (V-8S, adhesion: 0.6 N/20 mm, peeling direction: 180°). Next, appearance examination was performed using an optical microscope (400×) and if the wiring electrode portion was found to peel even slightly, it was determined to have been "peeling". This examination was performed on all the semiconductor light-emitting diodes obtained from one wafer, and the ratio of the number of the samples determined to have "peeling" with respect to the number of total samples was calculated as "peeling ratio of the wiring electrode portion". A micrograph of one of the semiconductor light-emitting diodes of Example 1 which was determined to have no peeling is presented as a representative example in FIG. 6.

(Evaluation Results)

The following can be found from Table 1. In Examples 1 to 3 and Comparative Examples 1, 2 where the line width $W_1$ of the wiring electrode portion is equal to or less than 4.0 µm which is half the line width in Conventional Examples 1 and 2, the light output power was significantly improved. In terms of only improving the light output power, Comparative Example 1 is most preferable. Comparing Conventional Example 1 with Conventional Example 2, the light output power is found to have improved slightly more in Conventional Example 2 where the line width $W_2$ of the flat surface portion F was smaller; however, in comparison with this improvement, the effect of reducing the line width $W_1$ of the wiring electrode portion was found to be more significant. This may be because not only did the light emitting area in the semiconductor layer surface simply increase, but also the light emitting area around the wiring electrode portion where current was most concentrated was increased.

However, comparing Conventional Examples 1 and 2 with Comparative Example 2, although the light output power was improved in Comparative Example 2, the peeling ratio of the wiring electrode portion was high. Thus, the semiconductor light-emitting diodes of Comparative Example 2 were found not to withstand commercialization. In comparison with Comparative Example 2, the peeling ratio was found to have been reduced in Examples 1 to 3 in which the conductive hard film was provided. In Comparative Example 1 where the thickness of the conductive hard film was 1.9 µm, the peeling ratio was high as in Comparative Example 2. The reason for this is probably that since the thickness of the wiring electrode portion was 0.8 µm, the thickness of the conductive hard film was extremely large, as large as twice the thickness.

INDUSTRIAL APPLICABILITY

This disclosure advantageously provides a semiconductor optical device with light extraction efficiency or light collecting efficiency higher than that of conventional devices and with a reduced peeling ratio of a wiring electrode portion, and a method of manufacturing the same.

REFERENCE SIGNS LIST

100, 200: Semiconductor optical device
300, 400: Semiconductor light emitting diode
110: Semiconductor layer
111: N-type semiconductor layer
112: Light emitting layer
113: P-type semiconductor layer
120: Wiring electrode portion
121: Metal layer
122: Conductive hard film
130: Pad electrode
140: Ohmic electrode
150: Insulating film
160: Reflective layer
170: Metal joint layer
180: Support substrate
190: Lower electrode
G: Growth substrate
F: Flat surface portion
R: Rough surface portion

The invention claimed is:

1. A semiconductor optical device comprising a semiconductor layer and a wiring electrode portion on a surface of the semiconductor layer that serves as one of a light emitting surface and a light receiving surface,
   wherein a line width of the wiring electrode portion is 2 µm or more and 5 µm or less,
   the wiring electrode portion has a metal layer on the semiconductor layer and a conductive hard film on the metal layer,
   the conductive hard film is harder than the metal layer, and
   a thickness of the conductive hard film is 0.7 µm or more and 1.5 µm or less.

2. The semiconductor optical device according to claim 1, wherein a vacant space is present between a region under a peripheral portion of the wiring electrode portion and the semiconductor layer.

3. The semiconductor optical device according to claim 2, wherein the surface of the semiconductor layer has a flat surface portion and a rough surface portion,
   part of the surface of the semiconductor wafer at a joint center where the surface of the semiconductor layer and the wiring electrode portion are joined to each other is the flat surface portion, and
   the vacant space is constituted by the rough surface portion.

4. The semiconductor optical device according to claim 3, wherein a line width of the flat surface portion at the joint center is 1.0 µm or more.

5. The semiconductor optical device according to claim 3, wherein at the joint center, a line width of the flat surface portion is smaller than a line width of the wiring electrode portion by 0.5 µm or more.

6. The semiconductor optical device according to claim 1, wherein the conductive hard film is a nitride of one or more metal elements selected from the group consisting of Ti, Ta, Cr, W, Mo, and V.

7. The semiconductor optical device according to claim 1, wherein the semiconductor layer includes an n-type semiconductor layer, a light emitting layer, and a p-type semiconductor layer in this order, and the surface of the semiconductor layer is a surface of one of the n-type semiconductor layer and the p-type semiconductor layer.

8. A method of manufacturing a semiconductor optical device, comprising a wiring electrode portion formation step of forming a wiring electrode portion on a surface of a semiconductor layer that serves as one of a light emitting surface and a light receiving surface,
   wherein a line width of the wiring electrode portion is 2 µm or more and 5 µm or less, and
   the wiring electrode portion formation step includes a first step of forming a metal layer on the surface of the semiconductor layer and a second step of forming a conductive hard film having a thickness of 0.7 µm or more and 1.5 µm or less on the metal layer.

9. The method of manufacturing a semiconductor optical device, according to claim 8, further comprising a vacant space formation step of forming a vacant space between a region under a peripheral portion of the wiring electrode portion and the semiconductor layer after the wiring electrode formation step.

10. The method of manufacturing a semiconductor optical device, according to claim 9, wherein in the vacant space formation step, the surface of the semiconductor layer is wet etched to roughen a part of the surface of the semiconductor layer lying under a peripheral portion of the wiring electrode portion to form the vacant-space.

* * * * *